United States Patent [19]
Klikier et al.

[11] Patent Number: 5,786,680
[45] Date of Patent: Jul. 28, 1998

[54] FIELD SENSOR POSITIONING APPARATUS AND METHOD

[76] Inventors: Leo L. Klikier, 645 Coveglen Ct., Colorado Springs, Colo. 80906-6801; Robbie Tuttle, 1905 Hercules Dr., Colorado Springs, Colo. 80906

[21] Appl. No.: 689,657
[22] Filed: Aug. 13, 1996
[51] Int. Cl.$^6$ ............................................. H02P 8/00
[52] U.S. Cl. .................. 318/696; 318/685; 318/490; 324/149
[58] Field of Search ........................ 324/149, 158.1, 324/76.11; 318/696, 685, 490

[56] References Cited

U.S. PATENT DOCUMENTS 5,530,460  6/1996  Wehl ............................ 324/158.1
5,614,819  3/1997  Nucci ........................... 324/158.1

*Primary Examiner*—Karen Masih
*Attorney, Agent, or Firm*—G. F. Gallinger

[57] ABSTRACT

An automated apparatus and method which can sequentially move a RF probe through the 16 measurement positions specified in the IEC 1000-4-3 field of uniformity measurement test. The time consuming task of precisely positioning the probe, entering and exiting/opening and closing the anechoic chamber and turning the power off while repositioning the probe is eliminated. The apparatus utilizes stepping motors. The apparatus is lightweight, mechanically simple, ascetic, rugged, consistently reliable and precise, and may be easily transported and set up.

19 Claims, 5 Drawing Sheets

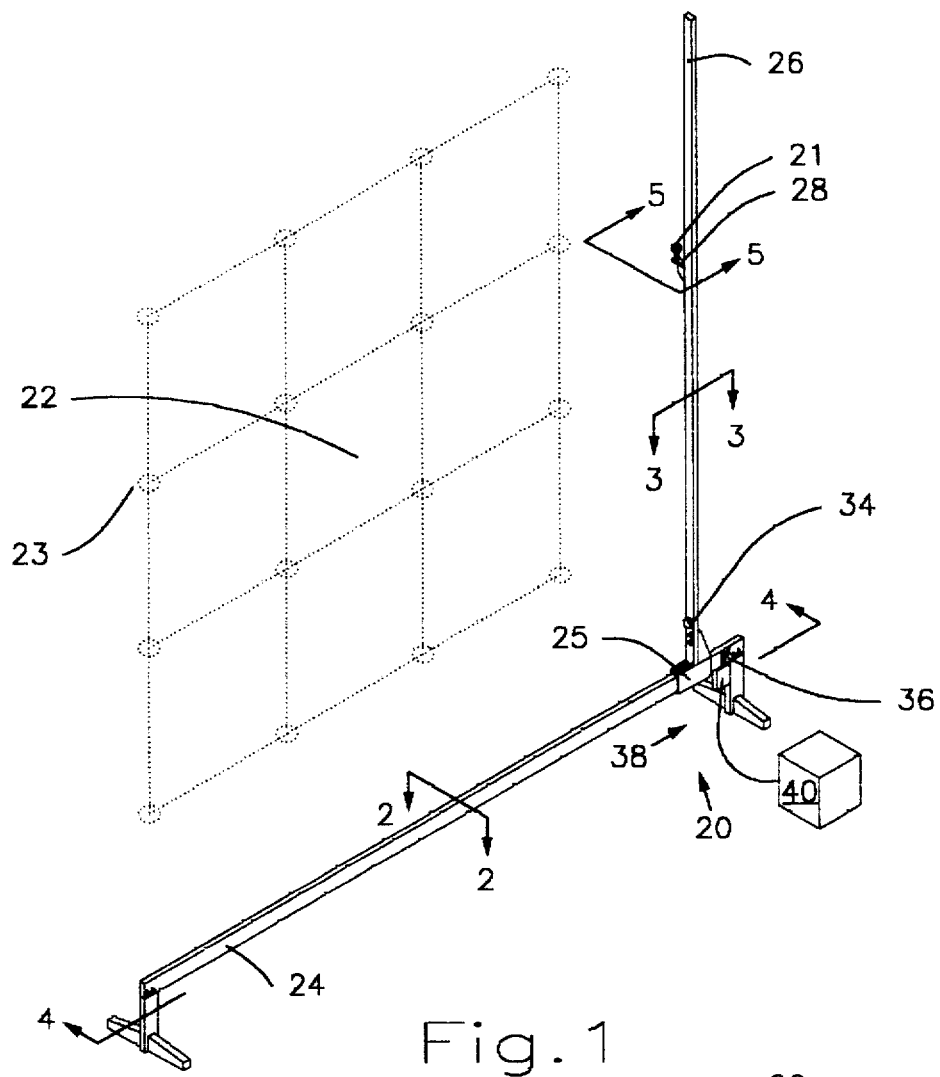
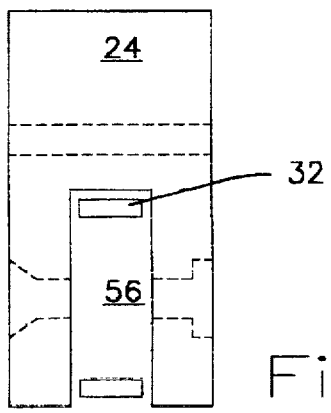
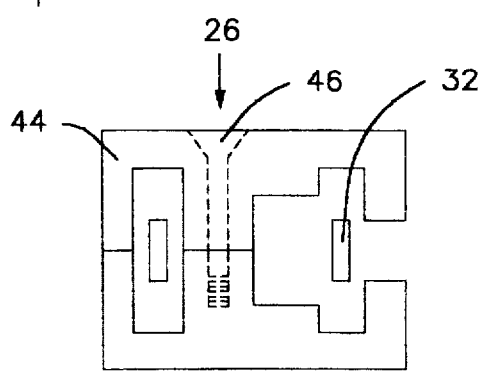
Fig. 1
Fig. 2
Fig. 3

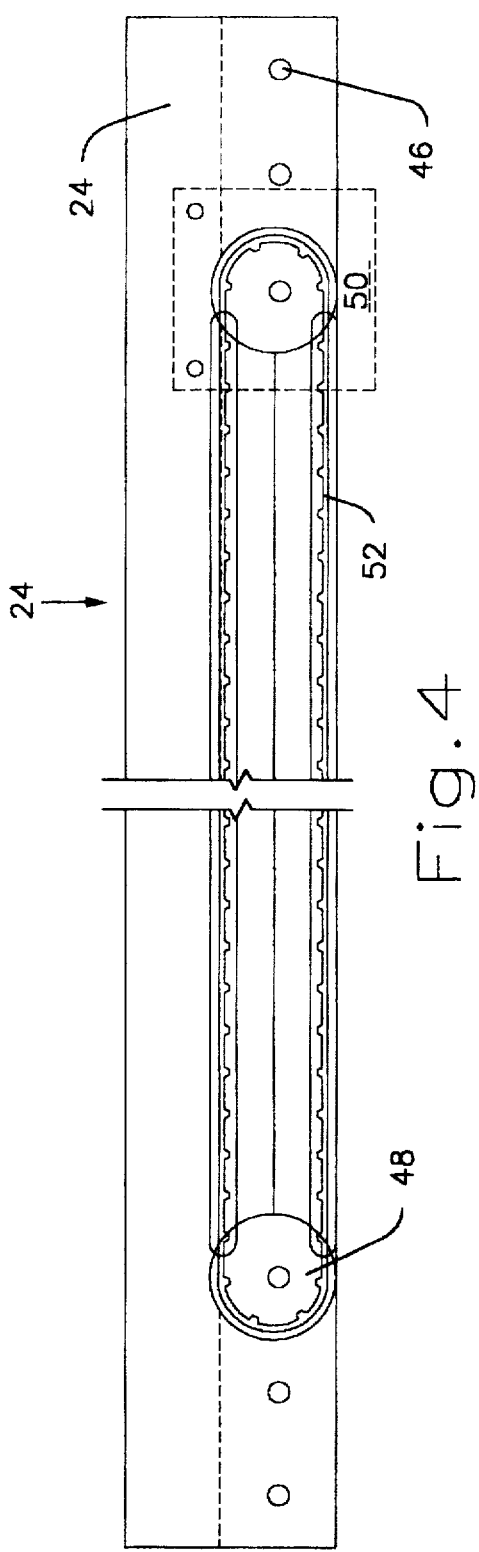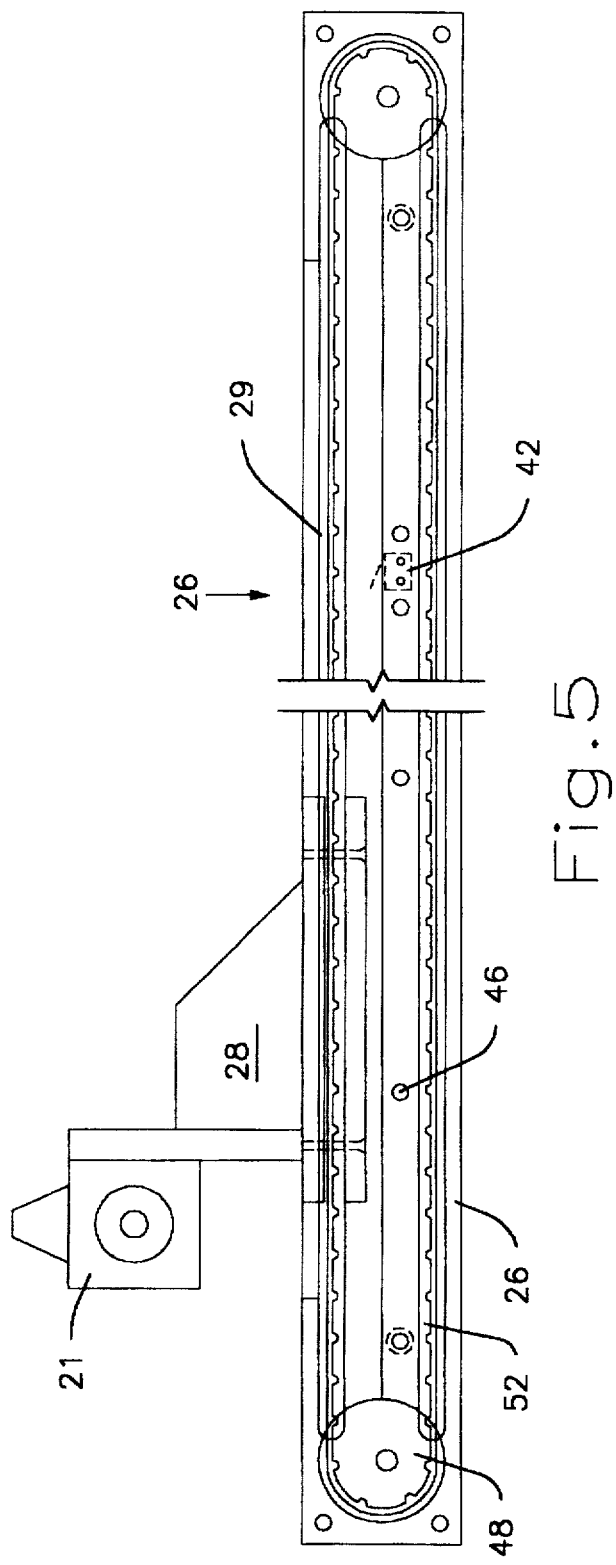

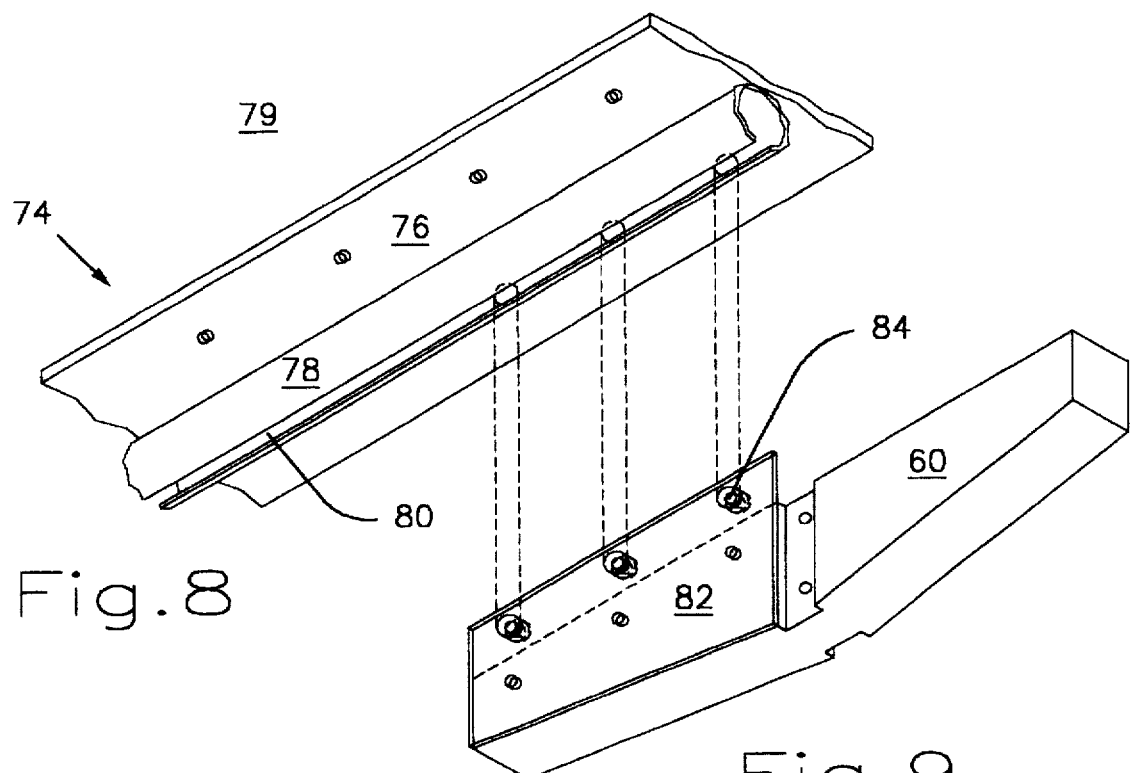
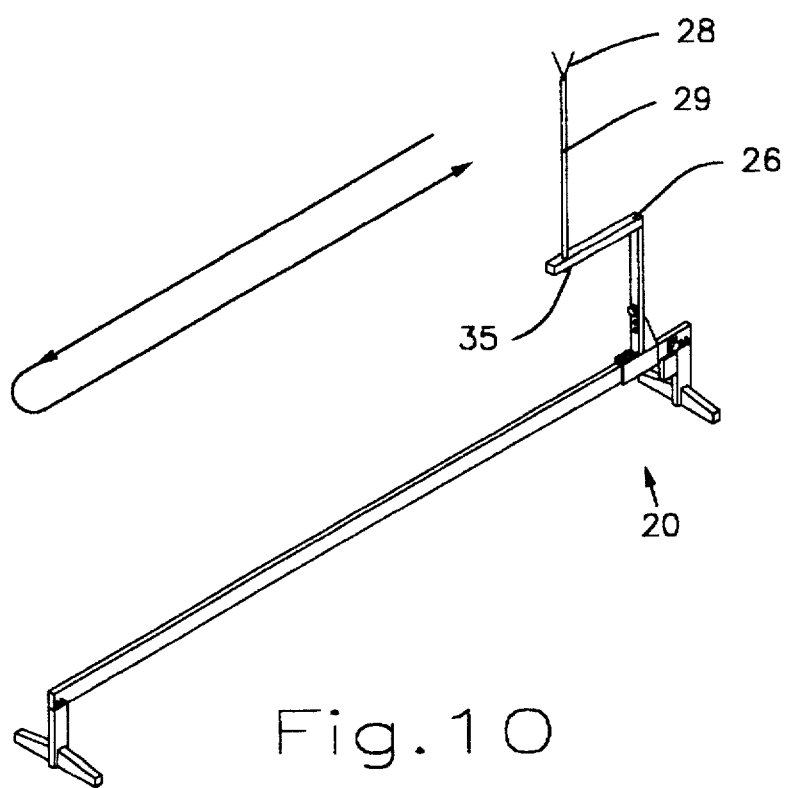

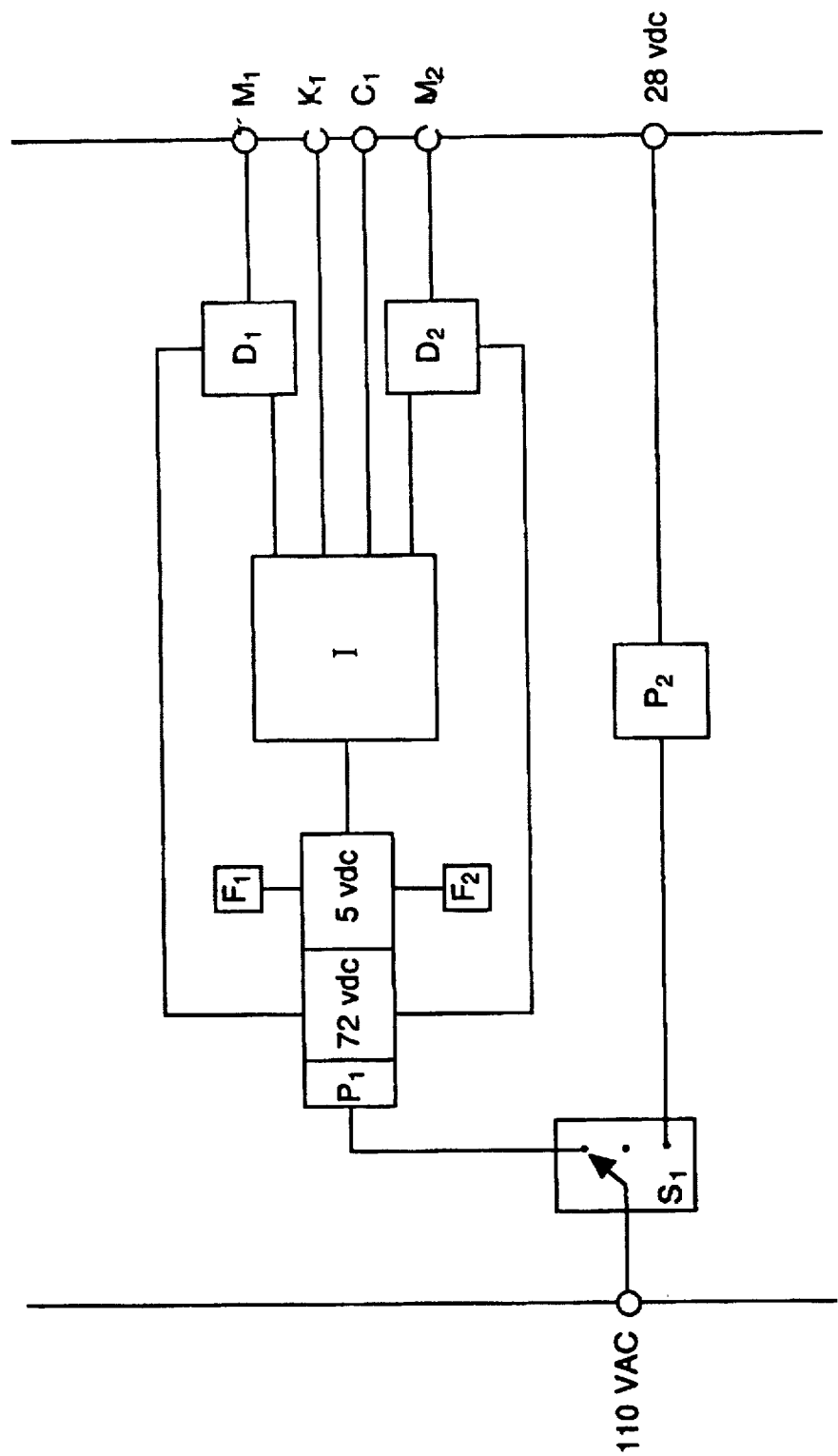

5,786,680

1

FIELD SENSOR POSITIONING APPARATUS AND METHOD

FIELD OF INVENTION

This invention relates to simulated open field testing of electric and electronic equipment in an anechoic chamber. More particularly this invention relates to an automated system which sequentially moves a RF probe through the 16 measurement positions specified in the IEC 1000-4-3 field of uniformity measurement test.

BACKGROUND OF THE INVENTION

Open field testing of equipment is simulated in anechoic chambers. Anechoic chambers are rooms which typically have floor, ceiling and walls lined with ferrite tiles to prevent entry of external electro magnetic radiation, and which also may have dense foam to prevent internal reflection of electro magnetic frequencies from equipment tested therein.

The IEC 1000-4-3 field of uniformity measurement text specifies that a RF probe sequentially measure RF emissions at 0.5 meter intervals across a 1.5 meter square 16 point test grid. The grid comprises a vertical plane having its lowest 4 point row of test points 80 centimeters above the floor.

The problem with manually moving a test probe through these 16 test points is that it is time consuming, not only to precisely position the probe, but to enter and exit, opening and closing the anechoic chamber and turning the power off while repositioning the probe. One solution to this problem is a field probe positioning system which uses battery power and fiber optic cables to control probe position. The problem with this elaborate system is that it is awkward and difficult to set up and calibrate; difficult and bulky, to transport; and uses battery power. What is needed is a simpler system that is rugged, consistently reliable, and which may be easily transported and set up.

OBJECTS AND STATEMENT OF INVENTION

It is an object of this invention to disclose a mechanically simple, and hence consistently reliable remotely controlled field sensor positioning apparatus. It is an object of this invention to disclose an apparatus which can precisely position a sensor sequentially through all 16 test points in an IEC 1000-4-3 field of uniformity measurement test grid without any intervention or sustained effort. It is an object of this invention to disclose an apparatus which can be integrated with other associated computer systems to fully eliminate all manual intervention during a test. It is yet a further object of this invention to disclose a lightweight, simple, aesthetic, and easily transportable and set up apparatus. It is yet a further object of this invention to disclose an apparatus which is flexible enough to move the sensor to any coordinates entered within the test grid. It is yet a final object of this invention to disclose an improved method of positioning a field sensor; a method which is consistently precise and reliable.

One aspect of this invention provides for an apparatus for remotely moving a sensor through multiple positions in a test grid. The apparatus comprises: a transom and a transom base; a slide carried by the transom; a mast carried by the slide; and a slidable sensor support carried by the mast. A slide stepping motor mounted on the transom together with a power conveyance means positioned between the slide stepping motor and the slide facilitate movement of the slide. A sensor support stepping motor mounted on the mast together with a sensor support power conveyance means

2 positioned between the sensor support stepping motor and the sensor support facilitate movement of the sensor support. A remote power control means is electrically connected to the stepping motors so that one may position the slidable sensor support from the remote power control means by causing the stepping motors to rotate and thereby moving the slide and slidable sensor support proportional distances to a chosen point in the grid.

Another aspect of this invention provides for an apparatus as above wherein the slide conveyance means is positioned wholly within the transom and the sensor support conveyance means is positioned wholly within the mast.

Various other objects, advantages and features of novelty which characterize this invention are pointed out with particularity in the claims which form part of this disclosure. For a better understanding of the invention, its operating advantages, and the specific objects attained by its users, reference should be made to the accompanying drawings and description, in which preferred embodiments of the invention are illustrated.

FIGURES OF THE INVENTION

The invention will be better understood and objects other than those set forth will become apparent to those skilled in the art when consideration is given to the following detailed description thereof. Such description makes reference to the annexed drawings wherein:

FIG. 1 is a perspective view of a field sensor positioning apparatus.

FIG. 2 is a lateral cross sectional view of a transom, shown in FIG. 1 as viewed from line 2—2 therein.

FIG. 3 is a lateral cross sectional view of a mast shown in FIG. 1 as viewed from line 3—3 therein.

FIG. 4 is a longitudinal cross sectional view of the transom taken on line 4—4 in FIG. 1.

FIG. 5 is a longitudinal cross sectional view of the mast as viewed from line 5—5 in FIG. 1.

FIG. 8 is a perspective view of a ceiling track used to mount the field sensor positioning apparatus in an inverted position.

FIG. 9 is a perspective view of a lateral base member having a runner positioned therealong for use in the track shown in FIG. 8.

FIG. 10 is a perspective view of a field sensor positioning apparatus adapted for a voltage standing wave ratio (VSWR) test with a rotatable mast carrying a antennae.

FIG. 11 is a block diagram showing the remote power control means and its electrical connections to the stepping motors.

Figure 6:
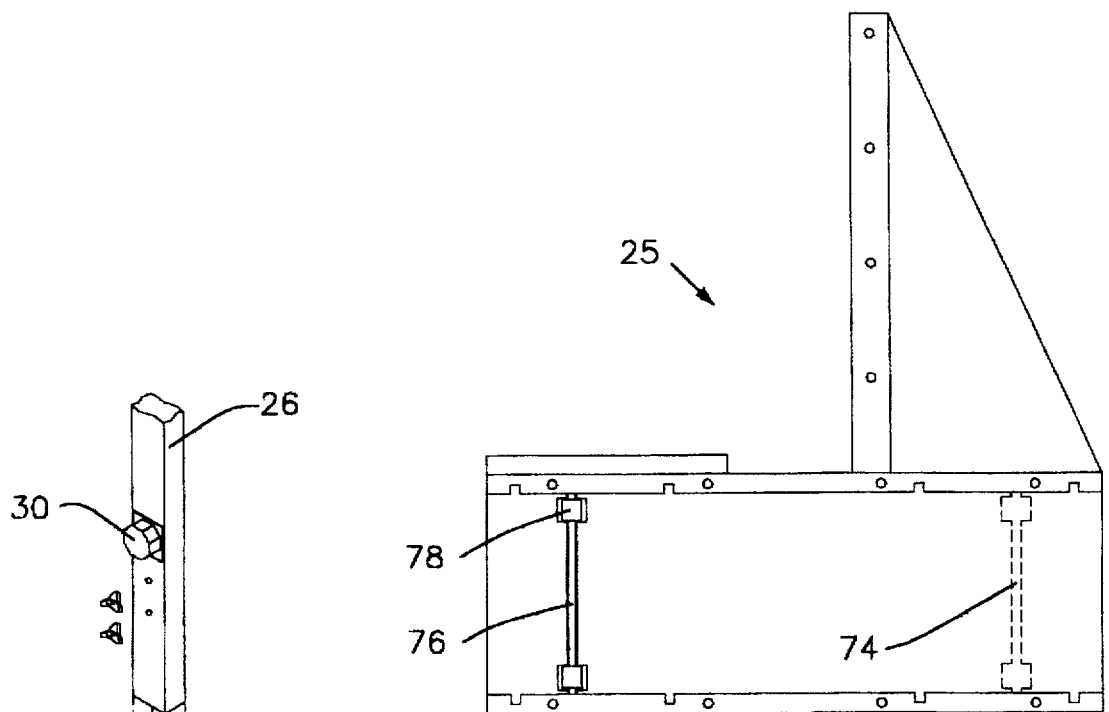
FIG. 6 is a cross sectional view of the slide positioned on the transom as shown in FIG. 1.

The following is a discussion and description of the preferred specific embodiments of this invention, such being made with reference to the drawings, wherein the same reference numerals are used to indicate the same or similar parts and/or structure. It should be noted that such discussion and description is not meant to unduly limit the scope of the invention.

DESCRIPTION OF THE INVENTION

Turning now to the drawings and more particularly to FIG. 1 we have a perspective view of a field sensor positioning apparatus 20. The apparatus 20, which is used to remotely move a sensor 21 through multiple positions in a test grid 22, comprises: a transom 24; a slide 25 carried by the transom 24; a mast 26 carried by the slide 25; a slidable sensor support 28 carried by the mast 26; a slide stepping motor 36 mounted on the transom 24; a power conveyance means 32 (shown on FIGS. 2 & 4) between the slide stepping motor 36 and the slide 25; a sensor support stepping motor 34 mounted on the mast 26; a power conveyance means 32 (shown on FIGS. 3 & 5) between the sensor support stepping motor 34 and the sensor support 28; a transom base 38; a remote power control means 40 electrically connected to the stepping motors 34,36.

In use one may position the slidable sensor 21 from the remote power control means 40 by causing the stepping motors 34,36 to rotate and thereby moving the slide 25 and slidable sensor support 28 proportional distances to a chosen point 23 in the grid 22. In the preferred embodiment of the invention the remote power control means 40 is programmed to sequentially move through each of the 16 points 23 in the test grid 22. Another option allows one to move to any specified coordinates within the test grid 22.

FIG. 2 is a lateral cross sectional view of the transom 24, shown in FIG. 1 as viewed from line 2—2 therein. FIG. 2 shows the power conveyance means 32 positioned wholly within the transom 24 in a longitudinal groove 56 on a bottom side portion thereof.

FIG. 3 is a lateral cross sectional view of the mast 26 shown in FIG. 1 and taken on line 3—3 therein. The mast 26 comprises two similar split half portions 44 which are held together by nylon bolts 46 after the conveyance means 32 is positioned wholly within the two half portions 44 forming the mast 26. The bolts 46 are inserted into the mast 26 from alternate sides as one moves therealong.

FIG. 4 is a longitudinal cross sectional view of the transom 24 taken on line 4—4 in FIG. 1. Holes 47, on opposite ends of the transom 24 are used to fasten the base 38 thereto. A timing belt 52, fastened to slide 25 (see FIG. 7) extends between two pulleys 48, one of which is driven by a stepping motor 36 which is bolted to a side portion 50 of the transom 24.

FIG. 5 is a longitudinal cross sectional view of the mast 26 as viewed from line 5—5 in FIG. 1. FIG. 5 shows a split half portion of the mast 26. Together the two split half portions of the mast 26 house the power conveyance means 32, a homing switch 42, and define a track 29 for the slidable sensor support 28. The power conveyance means 32 comprises a timing belt 52 and two pulleys 48. The homing switch 42, positioned on an end portion of the mast 26, defines a reference point from which to determine the starting position of the slidable sensor support 28. Holes 49, are alternated so that nylon bolts 46 are alternatively inserted into the mast 26 from alternate sides thereof.

FIG. 6 is a cross sectional view of the slide 25 positioned on the transom 24 as shown in FIG. 1. FIG. 6 shows how the slide 25 is grooved 74 to accommodate a shaft 76 and bearing 78. Bearings 78 are positioned in the interior sides, top, and bottom portions of the slide 25 to facilitate low friction sliding.

Figure 7:
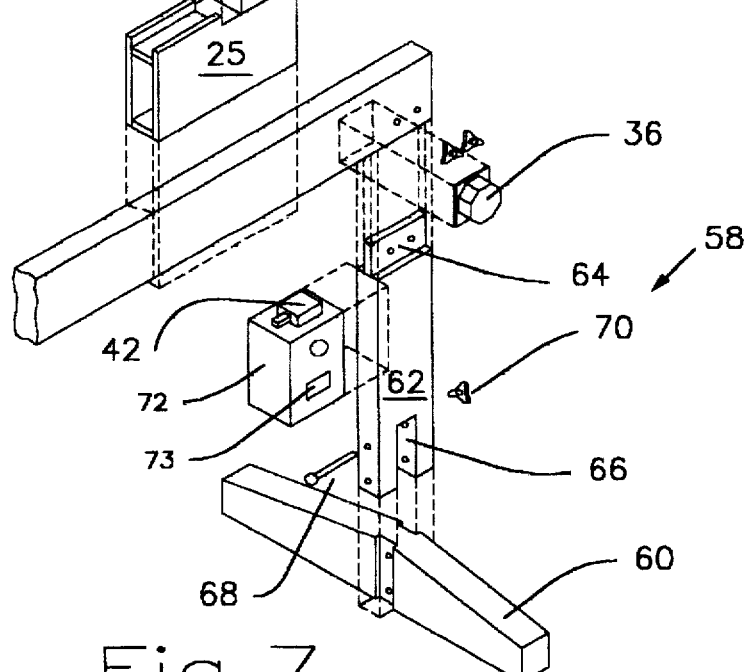
FIG. 7 is an exploded view of the drive side portion of the field sensor positioning apparatus shown in FIG. 1.

FIG. 7 is an exploded view of the drive side portion of the field sensor positioning apparatus 20 shown in FIG. 1. The base 38 comprises two similar transom end supports 58, each end support 58 having a lateral member 60 and a leg 62 extending upwardly from a central portion of the lateral member 60. The mast 26 is fastened to the slide 25, and the transom end supports 58 are fastened to the transom 24, and the lateral members 60 are fastened to the legs 62, with grooved 66 joints, each joint being fastened with two bolts 68 and nuts 70 which are adapted for tightening with fingers.

The transom 24 comprises a longitudinal groove 56 on a bottom side portion thereof, said groove accommodating the timing belt 52 and the tongue 64 on a top portion of the leg 62. Electrical box 72 houses jacks 73 and carries homing switch 42. Slide stepping motor 36 is bolted to the transom 24, and sensor support stepping motor 34 is bolted to the mast 26.

FIG. 8 is a perspective view of a ceiling track 74 used to mount the field sensor positioning apparatus 20 in an inverted position. The ceiling track comprises a track 78 which is made from an ABS plastic pipe having a longitudinal cut 80 generally ⅛" in width along its bottom side portion. The top portion of the pipe is screwed to clear plastic lexan strip 76, which in turn is screwed to a ceiling 79.

FIG. 9 is a perspective view of a lateral base member 60 having a runner 82 positioned therealong for use in the track 78 shown in FIG. 8. The runner 82 comprises nylon wheels which project laterally from a top side portion of the runner 78.

FIG. 10 is a perspective view of a field sensor positioning apparatus 20 adapted for a VSWR test with a rotatable antennae 28. More particularly the arm 27 carries a mast rotation stepping motor 35 which rotates a rotatable sensor support 29 carrying a antennae 28. In the VSWR test the antennae 28 must sweep back and forth across the transom 24 at a uniform rate of speed. The antennae must then be incrementally rotated 15 degrees, whereafter the said sweeps are repeated. After the antennae 28 has incrementally been rotated a full revolution the test is completed. In the preferred embodiment the remote power control means 40 is programmed to reiteratively cause the slide 25 to laterally sweep back and forth across transom 24 at a uniform rate, and then incrementally turn the rotatable sensor support 29; whereafter the iteration is repeated until such time as the rotatable sensor support 29 has completed one full revolution, then the VSWR test can be automatically completed without human intervention.

The apparatus 20 is generally made from delrin and phenalic. Delrin is self lubricating and has a high melting point; it is relatively stiff at ambient temperatures. The transom 24 is cut from a sheet of phenalic, a plastic which is layered with linen for strength. The probe generally employed is an isotropic field probe FP-2000. The apparatus 20 is built with OEM 57-40-MO TM stepping motors. Reference was made to stepping motors 34,35,36 in this application. Throughout the specification and claims stepping motor is defined to include a servo motor, which would perform comparably in this application.

FIG. 11 is a block diagram of the remote power control means 40 which is electrically connected to the stepping motors 34,35,36.

| PARTS LIST | |
| --- | --- |
| P1 | V1-PAFQ-EVY, power supply |
| P2 | Amplifier Research recharger |
| F1, F2 | TYP 605L, fan |
| D1, D2 | OEM 650, microstepping driver |
| I | OEM 6200, 2 axis indexer |
| K1 | RP 240, control panel & keypad |
| M1, M2 | OEM 57-40-MO, microstepping motor |
| C1 | jack for optional connection to an associated computer | is a parts list of the parts shown in FIG. 11.

While the invention has been described with preferred specific embodiments thereof, it will be understood that this description is intended to illustrate and not to homing the scope of the invention. The optimal dimensional relationships for all parts of the invention are to include all variations in size, materials, shape, form, function, assembly, and operation, which are deemed readily apparent and obvious to one skilled in the art. All equivalent relationships to those illustrated in the drawings, and described in the specification, are intended to be encompassed in this invention. What is desired to be protected is defined by the following claims.

I claim:

1. An apparatus for remotely moving a sensor through multiple positions in a test grid comprising:

a transom;

a slide carried by the transom;

a mast carried by the slide;

a slidable sensor support carried by the mast;

a slide stepping motor mounted on the transom;

a power conveyance means between the slide stepping motor and the slide;

a sensor support stepping motor mounted on the mast;

a sensor support power conveyance means between the sensor support stepping motor and the sensor support;

a transom base;

a remote power control means electrically connected to the stepping motors;

wherein use one may position the slidable sensor support from the remote power control means by causing the stepping motors to rotate and thereby moving the slide and slidable sensor support proportional distances to a chosen point in the grid.

2. An apparatus as in claim 1 further comprising homing switches positioned adjacent to one end portion of the transom and one end portion of the mast, and used to define a reference position for the slide and slidable sensor support.

3. An apparatus as in claim 2 wherein the slide conveyance means is positioned wholly within the transom and the sensor support conveyance means is positioned wholly within the mast.

4. An apparatus as in claim 3 wherein the conveyance means comprises a belt and two end pulleys.

5. An apparatus as in claim 4 wherein the conveyance means comprises timing belts.

6. An apparatus as in claim 3 wherein the base comprises two similar transom end supports, each end support having a lateral member and a leg extending upwardly from a central portion of the lateral member.

7. An apparatus as in claim 6 wherein the mast is fastened to the slide, and the transom end supports are fastened to the transom, and the lateral members are fastened to the legs, with notched tongue and grooved joints, each joint being fastened with two bolts and nuts, adapted for tightening with fingers.

8. An apparatus as in claim 6 wherein the mast comprises longitudinal split half portions which together house the power conveyance means, a homing switch, and define a track for the slidable sensor support.

9. An apparatus as in claim 8 wherein the transom comprises a longitudinal groove on a bottom side portion thereof, said groove accommodating the belt and a tongue on a top portion of a leg.

10. An apparatus as in claim 9 wherein the slide has grooves in its interior top bottom and side portions sized to accommodate a shaft and bearings positioned therealong to facilitate low friction sliding.

11. An apparatus as in claim 10 further comprising a track and a slide to accommodate an inverted hanging mount of the apparatus.

12. An apparatus as in claim 9 which is made from delrin and phenalic.

13. In an apparatus of the type having a transom, a slide mounted on the transom, a mast carried by the slide, a slidable sensor support and a sensor carried by the sensor support, a method of structuring and remotely moving the sensor through multiple positions in a test grid comprising the following steps:

mounting a stepping motor to motivate the slide, and a power conveyance means on the transom, electrically connecting the stepping motor to a remote power control means; and, using the remote power control means to laterally position the sensor.

14. A method as in claim 13 further comprising the steps of:

mounting a stepping motor to motivate the slidable sensor support, and a power conveyance means on the mast;

electrically connecting the stepping motor motivating the slidable sensor support to the remote power control means; and, using the remote power control means to laterally and vertically position the sensor.

15. A method as in claim 14 wherein the power conveyance means is wholly internal to the transom and the mast.

16. A method as in claim 15 wherein the remote power control means is programmed to consecutively stop the sensor at each of 16 points in a test grid.

17. A method as in claim 13 further comprising the steps of:

mounting a rotatable sensor support, and a stepping motor to motivate the rotatable sensor support, on the arm;

electrically connecting the stepping motor motivating the rotatable sensor support to the remote power control means, and, wherein the sensor is a antennae mounted on the rotatable sensor support carried by the mast;

using the remote power control means to laterally and rotatably position the sensor.

18. A method as in claim 16 wherein the power conveyance means for the slide is wholly internal to the transom.

19. A method as in claim 18 wherein the remote power control means is programmed to reiteratively cause the slide to laterally sweep back and forth across transom at a uniform rate, and then incrementally turn the rotatable sensor support; whereafter the iteration is repeated until such time as the rotatable sensor support has completed one full revolution.

* * * * *